United States Patent [19]

Przybysz et al.

[11] Patent Number: 4,904,980
[45] Date of Patent: Feb. 27, 1990

[54] REFRACTORY RESISTORS WITH ETCH STOP FOR SUPERCONDUCTOR INTEGRATED CIRCUITS

[75] Inventors: John X. Przybysz, Penn Hills; Joseph Buttyan, Wilkins Townshp, Allegheny County, both of Pa.

[73] Assignee: Westinghouse Electric Corp., Pittsburgh, Pa.

[21] Appl. No.: 234,436

[22] Filed: Aug. 19, 1988

[51] Int. Cl.[4] .............................................. H01C 1/012
[52] U.S. Cl. ..................................... 338/307; 338/308; 357/5; 427/96; 427/103; 156/625
[58] Field of Search ............... 338/307, 306, 308, 314, 338/325, 225 D; 357/5, 65, 71, 51, 55, 57; 427/58, 96, 101–103; 29/592 R, 610.1; 156/625, 635

[56] References Cited

U.S. PATENT DOCUMENTS

| | | | |
|---|---|---|---|
| 4,005,450 | 1/1977 | Yoshida et al. | 357/52 X |
| 4,128,845 | 12/1978 | Sakai | 357/55 X |
| 4,378,629 | 4/1983 | Bozler et al. | 357/55 X |
| 4,421,785 | 12/1983 | Kroger | 427/63 |
| 4,423,430 | 12/1983 | Hasuo et al. | 357/5 |
| 4,430,662 | 2/1984 | Jillie | 357/5 |
| 4,554,567 | 11/1985 | Jillie | 357/5 |
| 4,609,903 | 9/1986 | Toyokura | 338/225 D |
| 4,680,085 | 7/1987 | Vijan et al. | 357/56 X |
| 4,827,117 | 5/1989 | Uchida et al. | 357/2 X |
| 4,834,834 | 5/1989 | Ehrlich et al. | 156/635 X |

OTHER PUBLICATIONS

Paper by S. Kosaka et al., entitled "An Integration of All Refractor Josephson Logic LSI Circuit", IEEE Transactions on Magnetics, vol. MAG-21, No. 2, Mar. 1985, pp. 102–109.

*Primary Examiner*—B. A. Reynolds
*Assistant Examiner*—M.vin Lateef
*Attorney, Agent, or Firm*—R. A. Stoltz

[57] ABSTRACT

This is a structure of, and method for preparation of, molybdenum resistors in a superconductor integrated circuit. It utilizes a pattern superconductor film; applying an aluminum film on the patterned superconductor film; and then applying a molybdenum film on the aluminum film to provide an aluminum-molybdenum, etch-stop interface; applying a patterned resist film on the molybdenum film; etching the exposed molybdenum film to expose a portion of the aluminum-molybdenum, etch-stop interface; and oxidizing the exposed aluminum-molybdenum, etch-stop interface. The aluminum-molybdenum etch stop interface protects the patterned superconductor film and the support (including any other underlayers) and increases processing margins for the etch time. Preferably the etching of the exposed molybdenum film is by reactive ion etching and the oxidizing the exposed aluminum-molybdenum etch stop interface is by exposing the interface to a plasma containing about 25–75 volume percent oxygen and 25–75 volume percent argon) and the aluminum film is about 30–40 Angstroms thick).

10 Claims, 3 Drawing Sheets

REFRACTORY RESISTORS WITH ETCH STOP FOR SUPERCONDUCTOR INTEGRATED CIRCUITS

CROSS-REFERENCE TO RELATED APPLICATION

A process for etching insulators (e.g. silicone dioxide insulators) using a nitrogen trifluoride in argon etching is described in related application of Ser. No. 234,992, filed on Aug 22, 1988 assigned to the same assignee. That related process can also be used, in conjunction with the process described herein, during the manufacturing of superconductor integrated circuitry.

A superconducting digital logic amplifier for interfacing between a low voltage Josephson junction logic circuit and a higher voltage semiconductor circuit input is described in copending application Ser. No. 194,688, now U.S. Pat. No. 4,859,879, issued on Aug. 22, 1989; That amplifier uses a first series string of at least three lower critical current Josephson junctions (e.g. about 0.5 milliamp) connected in series with an input Josephson junction to provide a series combination and a second series string of at least four higher critical current (e.g. about 1.5 milliamp) Josephson junctions connected in parallel with the series combination to provide parallel strings having an upper common connection connected to the output terminal. A pulsed DC current source is connected to the parallel strings at the upper common connection. During a pulse from the DC current source, signal on the amplifier input exceeds the critical current of the input Josephson junction, which in turn causes the critical current of the other Josephson junctions in the amplifier to be exceeded, causing a higher power pulse on the output terminal during the remainder of the pulse from the current source. By using an appropriate number of junctions in the series strings, a low power signal from a Josephson logic circuit is raised, by the logic amplifier, to a power appropriate to drive a conventional semiconductor circuit.

BACKGROUND OF THE INVENTION

1. Field of the Invention

This invention relates to superconductor integrated circuits, and in particular provides an etch stop for the etching of molybdenum resistors in superconductor integrated circuits.

2. Description of Related Art

Superconductor integrated circuits using Josephson tunnel junction devices have been described in a number of U.S. Pat. Nos. (e.g. 4,430,662 issued February 7, 1984 and 4,554,567 issued Nov. 19, 1985, both to Jillie and Smith and both describing integrated circuitry and methods of manufacture, Josephson junction device configurations are also shown in U.S. Pat. Nos. 4,423,430 issued Dec. 27, 1983 to Hasuo et al. and 4,421,785 issued Dec. 20, 1983 to Kroger). The usage of molybdenum resistors is described, for example, in U.S. Pat. No. 4,609,903 issued Sept. 2, 1986 to Toyokura et al. U.S. Pat. No. 4,498,228, issued Feb. 12, 1985, to Jillie and Smith discloses a method of manufacturing a Josephson junction integrated circuit including the step of depositing and patterning the resistor material, which typically may be molybdenum, approximately 800 angstroms thick and also having an insulator layer comprising silicon dioxide, approximately 2500 angstroms thick. Jillie et al. note that the first layer of deposited insulator provides an etch stop for the upper niobium etch step. A paper by S. Kosaka et al. entitled "An Integration of All Refractory Josephson Logic LSI Circuit", (IEEE Transactions On Magnetics, volume MAG-21, No. 2, March 1985, pp. 102-109) provides several examples of etch stop by chemical selectivity, i.e., the layer being etched has a much higher etch rate than the layers underneath.

SUMMARY OF THE INVENTION

It has been discovered that an aluminum to molybdenum, metal to metal interface provides an extremely effective etch stop. This is apparently a new type of etch stop (in which an etchant etches either of the materials individually at relatively rapid rates, but does not appreciably etch the interface between the two in normal processing times). Although the reason why the aluminum-molybdenum metal to metal interface acts as an etch stop is not known, this has proved to be an extremely effective etch stop. As the interface and the aluminum underneath the interface remain metallic during the etching (and thus would short out the circuitry if allowed to remain metallic), the interface and the aluminum are oxidized after etching. The unusual properties of the interface are further illustrated above by the fact that individually, the aluminum film or the few monolayers of molybdenum are separately easily oxidized, but it has been found that relatively powerful oxidizing is required for the two when combined in the manner of this invention (thus after etching, a relatively powerful oxidizing must be used to convert the few monolayers of molybdenum and the aluminum film to oxide).

This is a method for preparing, and a structure of molybdenum resistors in a superconductor integrated circuit the method using; depositing superconductor film on a support; patterning the superconductor film; applying an aluminum film on the superconductor film; applying a molybdenum film on the aluminum film to provide material for the resistor and an aluminum-molybdenum etch stop interface; applying a patterned resist film on the molybdenum film to provide exposed molybdenum film and unexposed molybdenum film; etching the exposed molybdenum film down to, and thus exposing a portion of, the aluminum-molybdenum etch stop interface and defining the resistor; and oxidizing the exposed aluminum-molybdenum, etch-stop interface. The aluminum-molybdenum, etch-stop interface protects the patterned superconductor film and any other underlayers and increases processing margins for the etch time.

Preferably the etching of the exposed molybdenum film is by reactive ion etching or plasma etching (and most preferably by reactive ion etching) and the oxidizing the exposed aluminum-molybdenum etch stop interface is by exposing the interface to a plasma containing at least 25 volume percent oxygen (most preferably the plasma contains 25-75 volume percent oxygen and 25-75 volume percent argon) and the aluminum film is about 10-200 Angstroms thick) most preferably the aluminum film is about 30 Angstroms thick).

The molybdenum resistor configuration for a superconductor integrated circuit comprises: a support; areas of superconductor film covering portions of the support; a 10-200 Angstrom thick aluminum film on the areas of superconductor film; an aluminum-molybdenum etch stop interface on the aluminum film; a molybdenum film on the aluminum-molybdenum etch stop interface; and an aluminum oxide film on the support covering portions of the support not covered by the areas of superconductor film. Preferably, the aluminum film is about 30-40 Angstroms thick.

BRIEF DESCRIPTION OF THE DRAWINGS

This invention can be best understood by reference to the following drawings in which.

DESCRIPTION OF THE PREFERRED EMBODIMENTS

This invention provides a process for preparing molybdenum resistors and a superconductor integrated circuit.

Superconductor integrated circuits are desired for high speed signal processing. Josephson electronics has the potential for 100 GHz integrated receivers.

Circuits made from refractory materials have the highest reliability. Josephson junctions and superconducting interconnections can be made from niobium or niobium nitride. Resistor films made from 3000 Angstroms of molybdenum provide a sheet resistivity of 0.6 ohms per square, which is a desirable value for X-band digital logic circuits.

Typically, molybdenum films are sputter deposited, then patterned by reactive ion etching, since sputtered molybdenum is not suitable for liftoff. Problems arise in processing because sputtered films are not uniform in thickness. Even if the films could be made uniformly thick, the reactive ion etch process tends to etch faster at the edge of a wafer than in the center of a wafer. Hence, it is necessary to overetch some areas of the wafer, to allow time for the pattern to become fully defined in the slower portions of the wafer. This can cause undesirable attacks on the silicon dioxide and niobium underlayers that are exposed when the molybdenum is etched away. Chips at the edge of a wafer have been destroyed when the $CF_4+O_2$ plasma etched off the niobium interconnects before the molybdenum resistors on chips in the center of the wafer were completely defined.

The structure and a method of this invention fabricates molybdenum resistors with an etch stop layer to protect underlayers of niobium and silicon dioxide. The etch stop action is provided by a thin layer of aluminum, (e.g. approximately 30 Angstroms thick) which is sputtered in-situ, just prior to the molybdenum deposition.

Figure 1A:
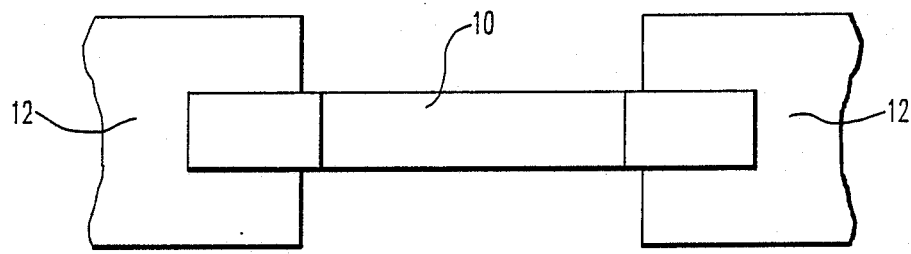
FIG. 1 is a diagram of the structure of the molybdenum resistors configuration (FIG. 1A is a plan view and FIG. 1B is an elevation.
Figure 1B:
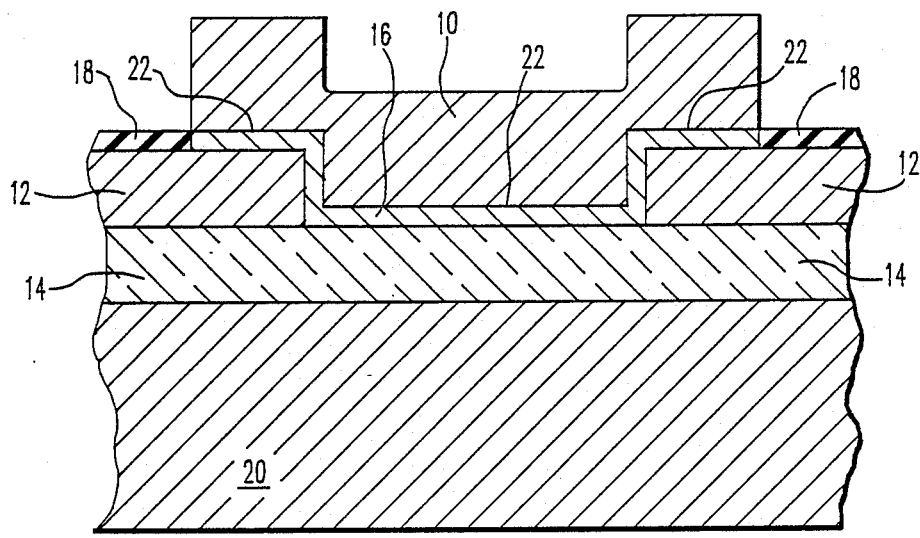

The structure of the new resistors is shown in FIG. 1. The resistor film 10 is made of molybdenum. The superconductor film 12 contacts are shown made of niobium (other superconductor materials can be substituted as known in the art). This structure is shown sitting on top of a layer of silicon dioxide 14. Generally structure is on a support 20 (which for these purposes can include the layer 14 and can include other circuit components). Beneath the resistors is a thin layer of about 30 Angstroms of aluminum 16. Areas of niobium and silicon dioxide that are not underneath the resistors are covered by a thin layer of oxidized aluminum 18. The aluminum-molybdenum, etch-stop interface 22 provides for better yield and improved circuits (by providing more uniform layers, for example, microwave properties are improved).

Resistors have been fabricated and tested. All the films were deposited by sputtering and patterned by reactive ion etching; plasma etching generally can be used. After the silicon dioxide and the niobium films had been deposited and patterned, the wafer was coated with 30 Angstroms of aluminum, followed by 3000 Angstroms of molybdenum.

Resistors were patterned by photoresist and reactive ion etched in a plasma of $CF_4+O_2$. Gas flow rates were 12.4 sccm of $CF_4$ and 1 sccm of $O_2$. Chamber pressure was 75 mT. Power density was 0.5 w/cm$^2$ of 13 MHz rf power. After 10 minutes, the molybdenum had been etched down to the etch stop layer.

Then the etch stop layer was oxidized in a plasma of oxygen and argon. The gas flow rates were 11.5 sccm of Argon and 8 sccm of oxygen. Chamber pressure was 75 mT and rf power density was 0.75 W/cm$^2$. The etch stop layer (interface) was oxidized for two minutes. The addition of the argon gas to the plasma provided high energy ions to churn and mix the etch stop layer, to expose all of the metal to the oxidizing plasma.

Figure 2A:
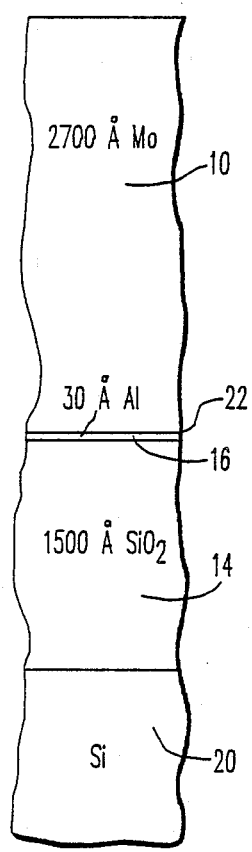
FIG. 2A shows a typical configuration of a resistor over an insulator and FIG. 2B shows depth versus reactive ion etch time for a molybdenum resistor film over silicon dioxide.
Figure 2B:
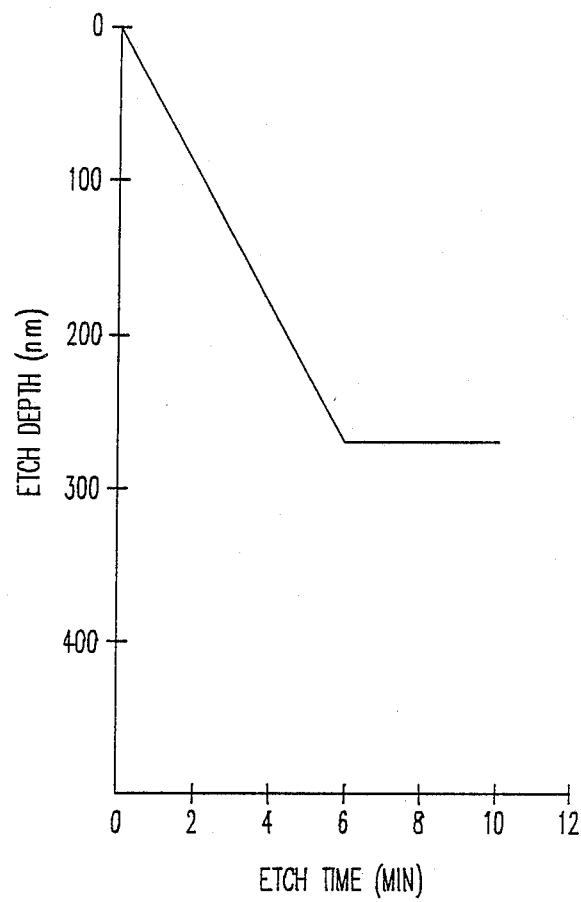

The action of the etch stop layer (interface) is illustrated in FIG. 2. In that experiment, a wafer was coated by sputtering 150 nm of silicon dioxide, then 3 nm of aluminum, followed by 270 nm of molybdenum. The wafer was etched in the previously described $CF_4+O_2$ plasma for two, four, six, and ten minutes. The etch depths were measured with a Tallystep profilometer. After six minutes, the molybdenum had been removed down to the etch stop layer. After ten minutes, the etch stop layer was still protecting the silicon dioxide underlayer. This allowed four minutes of extra etch time to ensure uniformity of the etching process over the entire wafer.

Figure 3A:
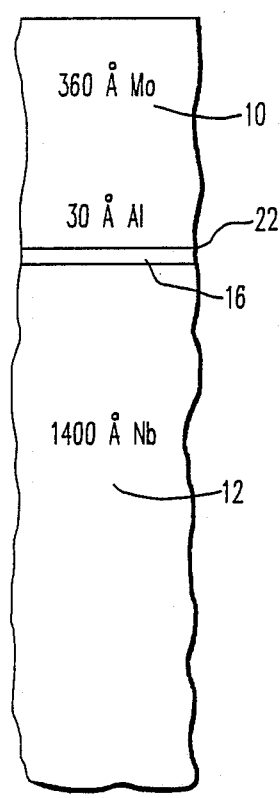
FIG. 3A shows a cross-section of molybdenum resistor over a niobium superconductor and FIG. 3B shows depth versus reactive ion etch time for such a configuration.
Figure 3B:
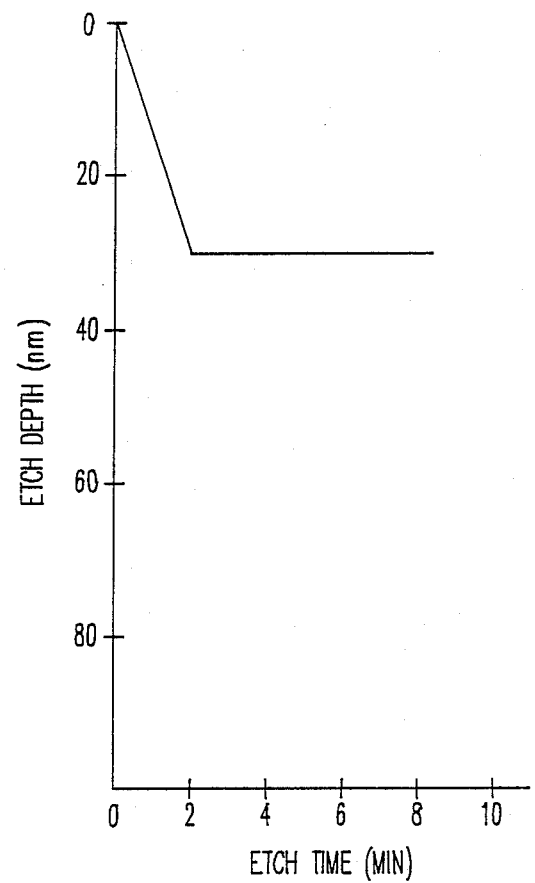

The aluminum etch stop layer also acts to protect an underlayer of niobium, as shown in FIG. 3. In that experiment, a silicon wafer was coated by sputtering 140 nm of niobium, followed by 3 nm of aluminum, then 36 nm of molybdenum. The molybdenum was kept thin in order to more accurately measure the penetration of the reactive ion etching into the etch stop. Reactive ion etching in the $CF_4+O_2$ plasma was conducted for two, four, and six minutes. After two minutes, the etch depth was measured as 30 nm. The same etch depth was measured for four and six minute etches. Again, the etch stop layer provided a margin of four minutes of extra etch time to the process, to obtain uniform pattern definition across the wafer.

Another experiment was performed to determine the resistance of aluminum to the reactive ion etching. A wafer was coated by sputtering 150 nm of silicon dioxide, followed by 3 nm of aluminum. The wafer was etched for two minutes in the reactive ion etcher. The aluminum layer did not protect the silicon dioxide underlayer. Significant etching of the silicon dioxide was observed. Table I gives typical etching rates for various materials using two commonly used etchants.

TABLE I

|  | $CCl_2F_2$ + Neon |
|---|---|
| SiO | 400 Angstroms/min. |

TABLE I-continued

| | | |
|---|---|---|
| SiO$_2$ | 550 | Angstroms/min. |
| Mo | 800-1000 | Angstroms/min. |
| Nb | 1700 | Angstroms/min. |
| CF$_4$ + O$_2$ | | |
| SiO | 500 | Angstroms/min. |
| SiO$_2$ | 550 | Angstroms/min. |
| Nb | 225 | Angstroms/min. |
| Al | 40 | Angstroms/min. |

These results, and other tests with aluminum under niobium, indicate that the etch stop is due to the interaction of the aluminum layer with the metal layer above it. Aluminum by itself will not stop the etch plasma. But aluminum with molybdenum on top of it will act as a very effective etch stop. The measurements in FIG. 3 even indicate that the molybdenum was not completely removed in the etching. Some sort of alloy layer or interface layer containing both aluminum and molybdenum seemed to stop the etch, although the mechanism of protection is not understood. The combined action of the aluminum and molybdenum to stop the etching might be similar to the way that a zinc-coating on steel inhibits the corrosion of the steel.

The interface layer combination explains the necessity of the oxygen plasma. A thin layer of 3 nm of aluminum would normally oxidize in the laboratory air. But the combined aluminum/molybdenum layer remained metallic and shorted out the entire circuit, until an oxygen/argon plasma was employed to convert the interface layer to insulator.

Thus, refractory resistors of molybdenum with an aluminum etch stop underlayer have been fabricated on superconductor integrated circuits. The molybdenum films can make electrical contact through the aluminum layer to the niobium interconnections. Plasma oxidation of the etch stop layer converts it to an insulator, to prevent shorting of isolated components. The etch stop layer protects both niobium and silicon dioxide underlayers from the reactive ion etch plasma. This increased the processing margins for the etch time, to guarantee complete etching of the molybdenum resistors across the entire wafer.

The invention is not to be construed as limited to the particular examples described herein as these are to be regarded as illustrative, rather than restrictive. The invention is intended to cover all structures and processes which do not depart from the spirit and scope of the invention.

What we claim is:

1. A method for preparing molybdenum resistors in a superconductor integrated circuit; said method comprising:
   (a) depositing superconductor film on a support;
   (b) patterning said superconductor film to provide a patterned superconductor and exposed support;
   (c) applying an aluminum film on said superconductor film and said exposed support;
   (d) applying a molybdenum film on said aluminum film to provide an aluminum-molybdenum, etch-stop interface;
   (e) applying a patterned resist film on said molybdenum film to provide exposed molybdenum film and unexposed molybdenum film;
   (f) etching said exposed molybdenum film to define the molybdenum resistor and expose a portion of said aluminum-molybdenum, etch-stop interface; and
   (g) oxidizing said exposed aluminum-molybdenum, etch-stop interface, whereby the aluminum-molybdenum, etch-stop interface protects the patterned superconductor film and the support and increases processing margins for the etch time.

2. The method of claim 1, wherein said etching of said exposed molybdenum film is by reactive ion etching or plasma etching.

3. The method of claim 2, wherein said etching of said exposed molybdenum film is by reactive ion etching.

4. The method of claim 2, wherein said etching of said exposed molybdenum film is by plasma etching.

5. The method of claim 1, wherein said oxidizing said exposed aluminum-molybdenum etch stop interface is by exposing said interface to a plasma containing at least 25 volume percent oxygen.

6. The method of claim 5, wherein said plasma contains 25-75 volume percent oxygen and 25-75 volume percent argon.

7. The method of claim 1, wherein said aluminum film is 10-200 Angstroms thick.

8. The method of claim 1, wherein said aluminum film is about 30-40 Angstroms thick.

9. A molybdenum resistor configuration for a superconductor integrated circuit; said resistor comprising:
   (a) a support;
   (b) areas of superconductor film covering portions of said support;
   (c) a 10-200 Angstroms thick aluminum film on said areas of superconductor film;
   (d) an aluminum-molybdenum etch stop interface on said aluminum film;
   (e) a molybdenum film on said aluminum-molybdenum etch stop interface; and
   (f) an aluminum oxide film on said support covering portions of said support not covered by said areas of superconductor film.

10. The resistor of claim 9, wherein said aluminum film is about 30-40 Angstroms thick.

* * * * *